(12) United States Patent
Bhagat et al.

(10) Patent No.: US 9,057,765 B2
(45) Date of Patent: Jun. 16, 2015

(54) SCAN COMPRESSION RATIO BASED ON FAULT DENSITY

(71) Applicant: International Business Machines Corporation, Armonk, NY (US)

(72) Inventors: Hardik Bhagat, Karnataka (IN); Baalaji R. Konda, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 13/861,427

(22) Filed: Apr. 12, 2013

(65) Prior Publication Data

US 2014/0310565 A1    Oct. 16, 2014

(51) Int. Cl.
   *G01R 31/3177* (2006.01)
   *G01R 31/3185* (2006.01)

(52) U.S. Cl.
   CPC .............................. *G01R 31/318547* (2013.01)

(58) Field of Classification Search
   CPC .............. G01R 31/318547; G01R 31/318335; G01R 31/318536; G01R 31/31921; G01R 31/3177; G01R 31/31813; G01R 31/318555; G01R 31/3187; G06F 11/263; G11C 2029/3202; G11C 29/12; G11C 29/32
   USPC .......... 714/726, 729, E11.155, 738, E11.024, 714/733, 724.3
   See application file for complete search history.

(56) References Cited

U.S. PATENT DOCUMENTS

| | | | |
|---|---|---|---|
| 5,991,909 A | 11/1999 | Rajski et al. | |
| 7,284,176 B2 | 10/2007 | Wang et al. | |
| 7,441,171 B2 | 10/2008 | Iyengar | |
| 7,552,373 B2 * | 6/2009 | Wang et al. | 714/729 |
| 7,818,644 B2 | 10/2010 | Rajski et al. | |
| 7,836,368 B2 | 11/2010 | Kapur et al. | |
| 7,945,833 B1 * | 5/2011 | Wang et al. | 714/729 |
| 7,979,764 B2 | 7/2011 | Foutz et al. | |
| 7,996,741 B2 * | 8/2011 | Touba et al. | 714/732 |
| 8,030,649 B2 | 10/2011 | Gschwind | |

(Continued)

FOREIGN PATENT DOCUMENTS

| | | |
|---|---|---|
| JP | 2009092531 A | 4/2009 |
| WO | 2005010932 A2 | 2/2005 |
| WO | 2009087769 A1 | 7/2009 |

OTHER PUBLICATIONS

Czysz, D. et al; "Low-Power Scan Operation in Test Compression Environment,"; Computer-Aided Design of Integrated Circuits and Systems, IEEE Transactions on , vol. 28, No. 11, pp. 1742-1755, Nov. 2009.

*Primary Examiner* — Phung M Chung

(74) *Attorney, Agent, or Firm* — Patricia B. Feighan; Michael Lestrange

(57) ABSTRACT

A processor-implemented method for determining scan compression ratio based on fault density. The processor-implemented method may include calculating, by a processor, a fault density value for each of a plurality of partitions of an integrated circuit. The fault density is computed by the processor based on a ratio of a total number of faults per partition to a total number of flip-flops per partition. The processor-implemented method further includes the processor determining a compression ratio for each of the plurality of partitions based on the fault density value for each of the plurality of partitions and applying the compression ratio to each of the plurality of the partitions of the integrated circuit.

15 Claims, 6 Drawing Sheets

(56) References Cited

U.S. PATENT DOCUMENTS

| | | | |
|---|---|---|---|
| 8,205,125 B2 * | 6/2012 | Hales et al. | 714/729 |
| 2006/0064614 A1 * | 3/2006 | Abdel-Hafez et al. | 714/726 |
| 2006/0066338 A1 | 3/2006 | Rajski et al. | |
| 2008/0091995 A1 | 4/2008 | Baik et al. | |
| 2011/0035638 A1 * | 2/2011 | Guo | 714/726 |
| 2011/0093752 A1 | 4/2011 | Gizdarski | |
| 2011/0099442 A1 | 4/2011 | Hales et al. | |
| 2011/0166818 A1 | 7/2011 | Lin et al. | |
| 2011/0258501 A1 | 10/2011 | Touba et al. | |
| 2012/0304031 A1 * | 11/2012 | Shah et al. | 714/729 |
| 2014/0122928 A1 * | 5/2014 | Wang et al. | 714/27 |

* cited by examiner

SCAN COMPRESSION RATIO BASED ON FAULT DENSITY

FIELD OF THE INVENTION

The present invention relates generally to integrated circuit testing, and more particularly, to applying non-uniform scan compression ratios based on fault density.

BACKGROUND

As the geometry of transistors with respect to technology in integrated circuits (microelectronic chips or micro chips) shrinks, the number and type of defects on a chip may increase exponentially with an increase in logic density. A defect is an error introduced into a device during the manufacturing process. A fault model is a mathematical description of how a defect alters design behavior. During the design of the integrated circuit, testing is performed to ensure that the integrated circuit works as anticipated. Testing of integrated circuits may be facilitated by design techniques known in the art as Design For Test (DFT), also known as Design for Testability. Automatic Test Pattern Generation and Automatic Test Pattern Generator (ATPG) is an electronic design automation technology used to find an input (or test) sequence that, when applied to a digital circuit, enables automatic test equipment to distinguish between the correct circuit behavior and the faulty circuit behavior caused by defects. Design for testability (DFT) based on scan and automatic test pattern generation (ATPG) were developed to explicitly test each gate and path in a design.

Therefore, a particular test logic design, used in conjunction with a DFT technique, may include more modeled defects and thus more scan flip-flops to accommodate for the increased number of modeled defects. The ratio between the modeled defects and the scan flip-flops may be referred to as fault density. The scan flip-flops may be organized in scan chains to facilitate defect testing. Typically, test time may be reduced by decreasing the scan chain length; however, a decrease in the scan chain length may alternatively increase the number of scan chains.

A larger number of test patterns may be required in order to effectively test the manufacturing defects of the microchip. The increase in the number of modeled faults and test patterns may increase the test time and power consumption associated with the test.

A microchip logic design may be divided into multiple logical boundaries referred to as partitions. The partition may include one or more sub-designs. Each sub-design may include one or more scan chains. The microchip may be partitioned into any number of partitions or test mode partitions and for any number of reasons, such as clock domains, design hierarchy including any custom test mode requirements, etc. Test mode may be defined as a mode in which the microchip is configured for manufacturing testing. Furthermore, fault density may be calculated on the partition and the sub design.

Scan compression may refer to the compression of the test patterns in order to effectively input or feed them to the scan chains. A scan compression ratio may be defined as the number of scan chains to the number of scan-in pins. A typical microchip design will have a larger number of logic scan chains relative to the number of scan-in pins. Current methods may use a uniform compression ratio by assigning the same scan compression ratio to partitions having different fault densities. However, the higher the compression ratio may be indicative of a higher amount of compression. Particularly, the higher compression ratio signifies feeding more scan chains from each scan-in pin. Conversely, the lower the compression ratio may be indicative of a lower amount of compression and as such, the lower compression ratio signifies feeding less scan chains from each scan-in pin.

Typical scan compression techniques may uniformly assign an even number of scan chains to receive test patterns from a single scan-in pin, and as such each scan-in pin would supply test patterns to the same number of scan chains. There are many different scan compression techniques which are useful for reducing the number of test patterns required and reducing the test time. However, none of them have the intelligence to select the compression ratio based on the type of design. A partition with a lesser number of faults and a greater number of scan flip-flops can undergo a higher scan compression compared to a partition with a higher number of faults and a lesser number of scan flip-flops. As such, uniform scan compression ratio allocation may cause inefficient pattern generation by an APTG tool because the fault density is not taken into account and the compression ratio is distributed evenly regardless of the type of design. Therefore, it may be desirable, among other things, to determine and assign non-uniform scan compression ratios during integrated circuit testing.

SUMMARY

According to at least one embodiment of the present invention, a processor-implemented method for determining scan compression ratio based on fault density is provided. The processor-implemented method may include calculating, by a processor, a fault density value for each of a plurality of partitions of an integrated circuit. The fault density is computed by the processor based on a ratio of a total number of faults per partition to a total number of scan flip-flops per partition. The processor-implemented method further includes determining a compression ratio for each of the plurality of partitions based on the fault density value for each of the plurality of partitions and applying the compression ratio to each of the plurality of the partitions of the integrated circuit.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
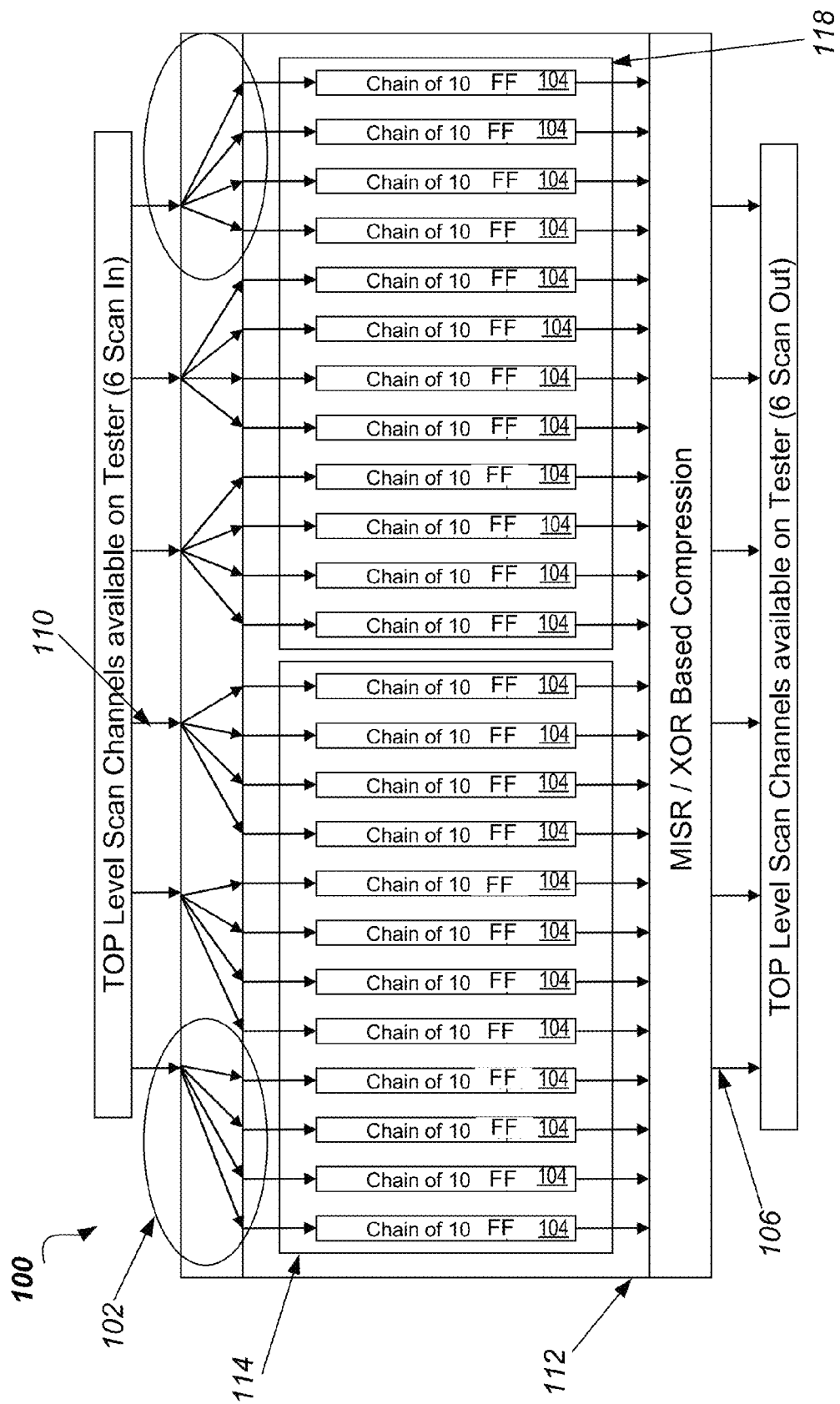
FIG. 1 illustrates an exemplary logic test design of an integrated circuit.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention relates generally to integrated circuit testing, and more particularly, to determining scan compression ratios based on fault density. The following described exemplary embodiments provide a system, method and program product to improve efficiency of known scan compression techniques used to test integrated circuits. For example, a partition with a lesser number of faults can undergo higher scan compression compared to a partition with a higher number of faults. In one embodiment, a partition may include multiple sub-designs. The method identifies the number of logical and physical partitions, the scan flip-flops for each partition, and the fault density of each logical and physical partition. It then calculates the compression ratio for the individual partition. Additionally, the method for improving the efficiency of the scan compression ratio may include adjusting the scan compression ratio based on fault design.

An integrated circuit (IC) design generally must be tested to ensure computer simulations of circuit designs function as expected in the real world. Thus, during the design of the integrated circuit, testing is performed to ensure that the integrated circuit works as anticipated. Later, once the design has been finalized and the integrated circuit is manufactured, each die produced must generally be tested to ensure that it operates correctly. The integrated circuit testing is necessary during the manufacturing process because integrated circuit fabrication is a complex and precise process susceptible to minute contaminates and variations that can cause the integrated circuit not to function properly.

Testing, during both design and production, may include manufacturing testing. In manufacturing testing, test patterns are provided to the integrated circuit. The integrated circuit then performs one or more operations using the test patterns. The results are then analyzed to ensure their validity.

Manufacturing testing of integrated circuits may be facilitated by design techniques known in the art as Design For Test (DFT), also known as Design For Testability. The DFT techniques may include adding circuitry to an integrated circuit, whereby the primary purpose of the circuitry is to facilitate testing of the integrated circuit. The DFT techniques often facilitate reading and writing the internal state of the integrated circuit more directly than is possible during normal operation. It is noted that such circuitry generally has no harmful effects during functional operation. The circuitry can thus be incorporated into the integrated circuit even though an end user may never use its capabilities.

One DFT technique known in the art is scan design. In scan design, a circuit under test (CUT) is loaded with test patterns using inputs on the integrated circuit housing the CUT. The CUT then performs one or more operations using the loaded test patterns. These operations are known in the art as "capture cycle(s)". The contents of each register in the CUT resulting from these operations may be observed directly via outputs on the integrated circuit. If there is some divergence between the output and an expected result, a problem in the CUT likely exists. If the output matches the expected result, there is more confidence that the CUT is functioning properly.

In scan design, one or more scan chains may be used to load test patterns and to output the results of the capture cycles. A scan chain connects registers within the CUT into one long shift register. Registers within the CUT may include scan flip-flops, latches and any other technological device capable of storing data.

By way of example, referring to FIG. 1, a typical logic test design of an integrated circuit 100 is depicted. The logic test design of integrated circuit 100 may include six scan-in pins 110 and may have six scan-out pins 106. The logic test design of integrated circuit 100 may include a first partition 114 and a second partition 118. Each of the partitions may, for example, include a first 114 and a second 118 partition having twelve scan chains 104. Each of the scan chains 104 may have ten scan flip-flops.

Generally, there may be a need to compress data when there is a fewer number of scan-in pins 110 relative to the number of scan chains 104. For example, the design 100 may include six scan-in pins 110 and twenty-four scan chains 104. As such, each scan-in pin 110 may provide test data to more than one scan chain 104. A compression ratio may be defined as the ratio between the number of scan chains 104 and the number of scan-in pins 110. For example, there may be twenty-four scan chains 104 and six-in pins 110 which may yield a uniform compression ratio of 4:1 (i.e. four scan chains 104 for one scan-in pin 110).

Since a partition with a lesser fault density can undergo higher scan compression ratio compared to a partition with a higher fault density, assigning a uniform compression ratio may not be very efficient. Using a scan compression technique that may be performed on any nanometer chip and is applied according to the fault density of the partition, may provide a more efficient compression ratio selection for reduction in test data volume and reduction in test application time on the tester. One embodiment to improve scan compression techniques is introduced in detail below by referring to the accompanying drawings FIGS. 2-5.

Figure 2:
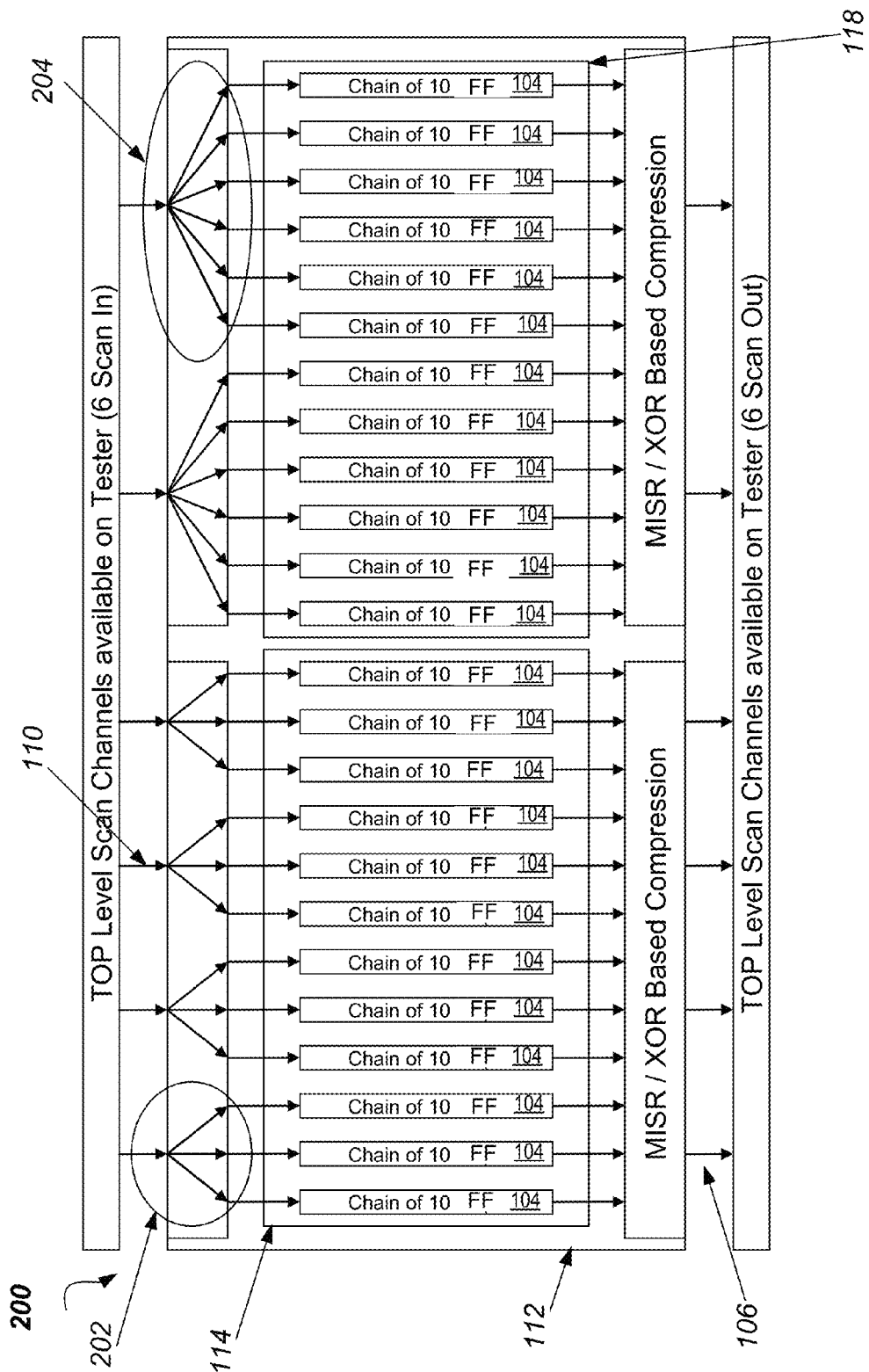
FIG. 2 illustrates an exemplary logic test design of an integrated circuit according to one embodiment.

Referring now to FIG. 2, a logic test design is shown. Logic circuit 200 may be tested on the testing apparatus 302 (FIG. 3) described below. By way of example, an integrated circuit 200 is depicted on which embodiments of the present invention may be practiced. The logic test design of an integrated circuit 200 may be substantially similar to the logic test design of integrated circuit 100 (FIG. 1) previously described. The integrated circuit 200 may have six scan-in pins 110 and six out pins 106. Additionally, the integrated circuit 200 may also have two partitions 114, 118. Each of the partitions 114, 118 may have twelve scan chains 104 and each of the scan chains 104 may have ten scan flip-flops.

As previously explained, there is a need to compress data when there is a fewer number of scan-in pins 110 relative to the number of scan chains 104. Similar to integrated circuit 100, integrated circuit 200 has more scan chains 104 than scan-in pins 110, and therefore, requiring a need to compress the data. However, the compression ratio of integrated circuit 200 may be customized to account for partitions having varying fault densities. As previously discussed, the fault density of a partition may affect testing efficiency. Customizing the compression ratio, such as that shown with respect to integrated circuit 200, may improve efficiency.

As previously described, a partition, such as, 118, with a lesser fault density can undergo a higher scan compression, compared to a partition, such as 114, with a higher fault density, which may conversely require a lower compression ratio. As such, uniform scan compression ratio allocation may cause inefficient pattern generation by an APTG tool because the fault density is not taken into account and the compression ratio is distributed evenly regardless of the type of design.

In one embodiment, the scan compression ratio may be determined based on fault density. The fault density value for each of the partitions 114, 118 of the integrated circuit 200 may be calculated based on a ratio of a total number of faults per partition to a total number of scan chains 104 per partition 114, 118. As such, the compression ratio for each of the partitions 114, 118 then may be calculated based on the fault density value for each of the partitions 114, 118. Therefore, a partition, such as 114, having a high fault density may be assigned a low compression ratio. As previously explained, less compression means more scan-in pins 110 per the number of scan chains 104. Similarly, a partition, such as 118, having a low fault density may be assigned a high compression ratio. Therefore, a partition, such as 118, with a lesser fault density can undergo a higher scan compression compared to a partition, such as 114, with a higher fault density. As previously described, determining the compression ratio allocation based upon the fault density of the partition 114, 118 may cause more efficient pattern generation by an APTG tool since the increase in the number of modeled faults and test patterns may increase the test time and test power. Therefore, the fault density may directly affect the test time and test power.

With respect to FIG. 2, the number of scan chains 104 is greater than the number of scan-in pins 110. However, the compression ratio may not be evenly distributed for the entire integrated circuit 200 as it may be in 100 (FIG. 1), i.e. 4:1. For example, the number of scan chains 104 per scan-in pin 110 may be an uneven distribution of three scan chains 104 to one scan pin 110, i.e. 3:1 FIG. 2 (202) or six scan chains 104 to one scan pin 110, i.e. 6:1 FIG. 2 (204) as opposed to the uniformly distributed four scan chains 104 per one scan pin 110, i.e. 4:1, as indicated at 102 (FIG. 1). Nevertheless, there may still be a need to compress data since there is a fewer number of scan-in pins 110 relative to the number of scan chains 104. Therefore, it may be desirable, among other things, to determine the scan compression ratio based on the logic or fault density for a given partition.

Figure 3:
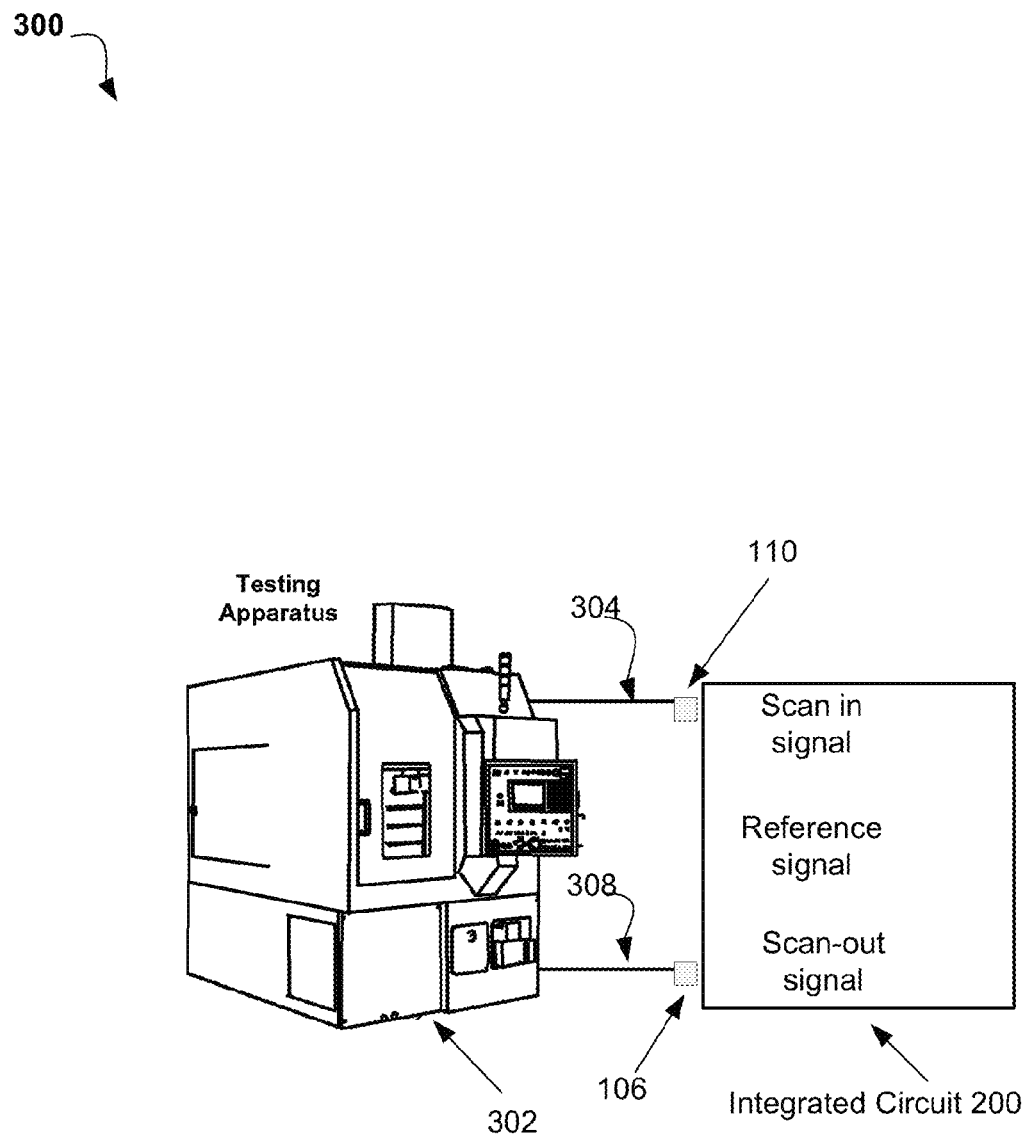
FIG. 3 illustrates an exemplary system for testing an integrated circuit, according to one embodiment.

Referring to FIG. 3, an exemplary system 300 for testing an integrated circuit, in accordance with one embodiment is shown. FIG. 3 includes an integrated circuit 200. The logic design of integrated circuit 200 was previously described above in relation to FIG. 2. Specifically, the integrated circuit 200 may include scan-in signals 304, scan-out signals 308 and scan-in pins 110.

The testing apparatus 302 may be electrically coupled to one or more scan-in pins 110. Specifically, a scan-in signal 304 may be coupled to scan-in pins 110. Using this connection to the one or more electrically coupled scan-in pin 110, the testing apparatus 302 may be configured to load test pattern data into the scan chains 104 of the integrated circuit 200. As a result, each register may be loaded with desired values.

The testing apparatus 302 may be configured to affect one or more testing operations on the test pattern data previously loaded. Specifically, the testing apparatus 302 may cause the integrated circuit 200 to perform at least one computational operation on the test pattern data provided to the integrated circuit 200 via the scan chains 104.

The testing apparatus 302 may be configured to receive the results of the processing of the outputs of the scan chains 104 of the integrated circuit 200 via scan-out pin 106. The testing apparatus 302 may be electrically coupled to a scan-out signal 308 generated by the integrated circuit 200 following the test pattern data being applied by the testing apparatus 302 via scan-in pin 110. Then, the testing apparatus 302 may be configured to analyze the test pattern data received to determine the validity of the outputs of the scan chains 104, i.e. whether the outputs are useful. The testing apparatus 302 may further be configured to indicate a malfunction of the integrated circuit 200 if the outputs are determined not to be valid.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In an embodiment of the present invention, the testing apparatus is implemented in software on one or more appropriately programmed general purpose digital computers having a processor, memory and input/output interfaces. The testing apparatus 302 may be configured to select appropriate test patterns to effect testing of the integrated circuit 200. It is noted that methods are known in the art for determining the number and nature of test patterns that should be performed to achieve a desired statistical confidence level that an integrated circuit is functioning properly.

In an embodiment of the present invention, the system 300 (FIG. 3) is configured to determine scan compression ratio based on fault density. The fault density value for each of the partitions 114, 118 of the integrated circuit 200 may be calculated based on a ratio of a total number of faults per partition 114, 118 to a total number of scan flip-flops (for each scan chain 104) per partition 114, 118. Then the system 300 determines a compression ratio for each of the partitions 114, 118 based on the fault density value for each of the partitions 114, 118 and applies the compression ratio to each of the partitions 114, 118 of the integrated circuit 200. The method is explained in further detail below with respect to FIGS. 4A-4B.

Figure 4A:
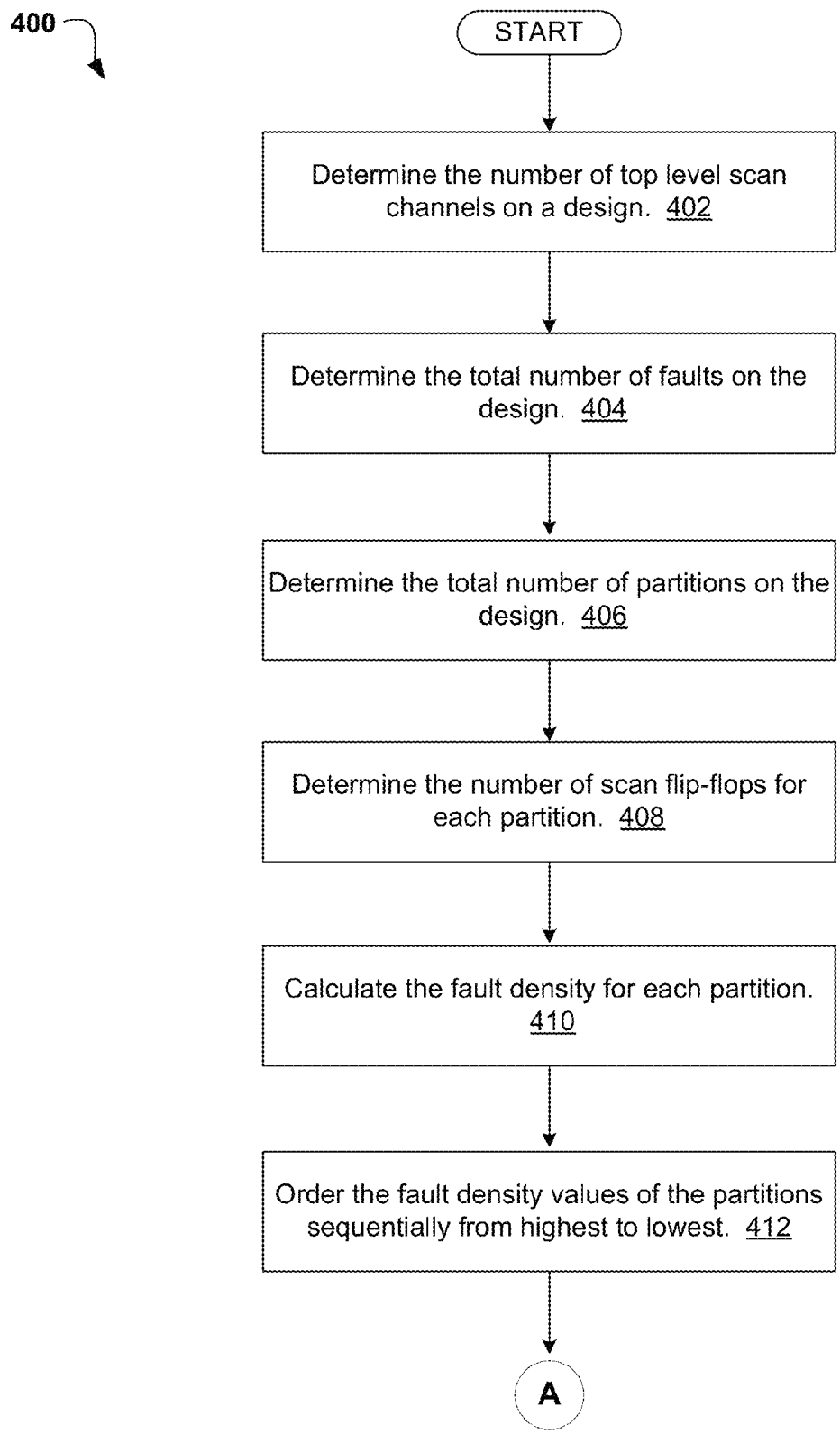
FIGS. 4A-4B is an operational flow chart for providing non-uniform scan compression ratio testing of integrated circuits.
Figure 4B:
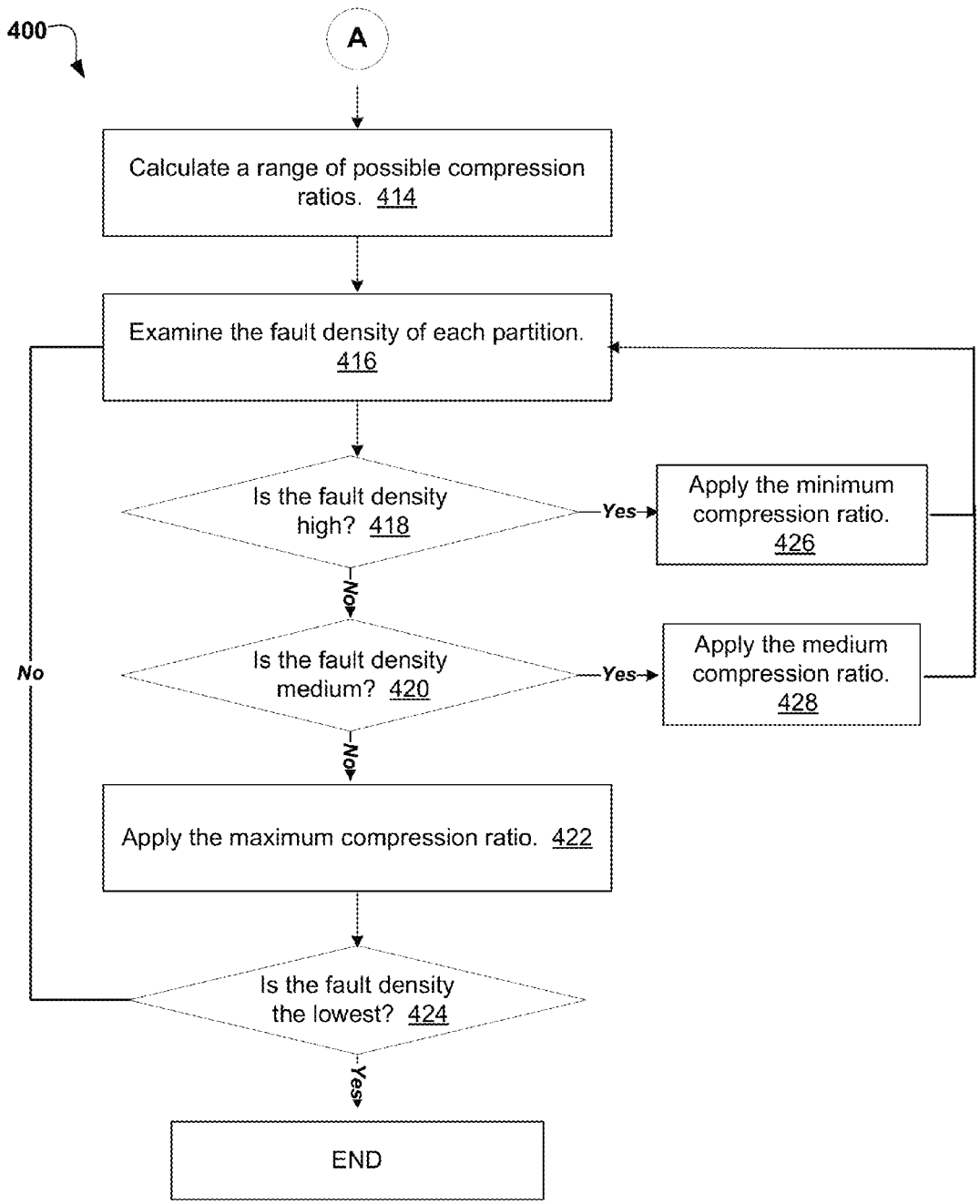

FIGS. 4A-4B is a flow chart illustrating the steps carried out by a scan compression ratio program to determine optimal logical and physical partitions by calculating scan compression ratio based on fault density. Flowchart 400 may be described with the aide of integrated circuit 100, integrated circuit 200 and system architecture 300.

Referring to FIG. 4A, at 402, the number of top level scan-in pins 110 on a design, i.e. integrated circuit 200 is identified. For example, with respect to FIG. 2, the scan compression ratio program 400 running on testing apparatus 302 (FIG. 3) may identify six scan-in pins 110 on integrated circuit 200.

Then at 404, the total number of faults on the partitions 114, 118 (FIG. 2) are identified. The number of faults on partitions 114, 118 are determined by using the current Automatic Test Pattern Generation (ATPG) tools. Electronic design automation (EDA) is a category of software tools for designing electronic systems such as integrated circuits 200. The tools work together in a design flow that chip designers use to design and analyze entire semiconductor chips. As previously described, an ATPG tool is an electronic design automation (EDA) method/technology used to find an input (or test) sequence that, when applied to a digital circuit, enables automatic test equipment to distinguish between the correct circuit behavior and the faulty circuit behavior caused by defects. The generated patterns are used to test semiconductor devices after manufacture, and in some cases to assist with determining the cause of failure.

As previously explained, a defect is an error introduced into a device during the manufacturing process. A fault model is a mathematical description of how a defect alters design behavior. The logic values observed at the device's primary outputs, while applying a test pattern to some device under test (DUT), are called the output of that test pattern data. The output of a test pattern, when testing a fault-free device that works exactly as designed, is called the expected output of that test pattern. A fault is said to be detected by a test pattern if the output of that test pattern, when testing a device that has only that one fault, is different than the expected output.

As such, the total number of faults is identified using an ATPG tool. For example, the scan compression ratio program 400 running on testing apparatus 302 would engage the existing logic on the integrated circuit 200 running an ATPG tool to determine the total number of faults on integrated circuit 200.

Then, at 406, the scan compression ratio program 400 running on testing apparatus 302 would identify the total number of logical and physical partitions on the design, i.e. the entire integrated circuit 200. For example, with respect to FIG. 2, the scan compression ratio program 400 running on apparatus 302 would identify two partitions 114, 118 on the entire integrated circuit 200.

At 408, the scan compression ratio program 400 running on apparatus 302 would identify the total number of scan flip-flops for each partition 114, 118. A scan flip-flop is a circuit that has two stable states and can be used to store state information. Scan flip-flops are part of the scan chain 104 and may be a fundamental building block of digital electronics systems used in computers, communications, and many other types of systems. Scan flip-flop chains 104 are used as data storage elements.

For example, with respect to FIG. 2, the scan compression ratio program 400 running on testing apparatus 302 would identify that each of the twelve scan flip-flop chains 104 on each of partitions 114, 118 has a chain of ten flip-flops. As such the scan compression ratio program 400 running on testing apparatus 302 may determine the total number of scan flip-flops for each partition 114, 118 to be (one-hundred twenty) for the integrated circuit 200 by multiplying the total number of scan flip-flop chains 104 (twelve per each partition FIG. 2) for each partition 114, 118 by the total number of scan flip-flop chains (ten per scan flip-flop chain in FIG. 2) to yield (one-hundred twenty) as the total number of scan flip-flop chains for each of the partitions 114, 118 of integrated circuit 200 depicted in FIG. 2.

Then at 410, the fault density may be calculated. The fault density is calculated by dividing the total number of faults for the partitions 114, 118 by the total number of scan flip-flop chains (i.e. one-hundred twenty) for the partitions 114, 118. As previously discussed, the fault density of an integrated circuit may be determined by engaging the existing logic on the integrated circuit 200 running the ATPG tool. For example, with respect to FIG. 2, the scan compression ratio program 400 running on testing apparatus 302 would engage the existing logic on the integrated circuit 200 running an ATPG tool to determine the total number of faults on integrated circuit 200.

Therefore, for illustrative purposes only with respect to FIG. 2, the ATPG tool may, for example, determine that there are twenty-four hundred faults on partition 114 of integrated circuit 200 and twelve hundred faults on partition 118 of integrated circuit 200. Additionally, for example, the scan compression ratio program 400 running on testing apparatus 302 may calculate the total number of scan flip-flop chains to be (one-hundred twenty) for each partition 114, 118. As such, the scan compression ratio program 400 running on testing apparatus 302 may calculate the fault density of the partition 118 of integrated circuit 200 by dividing the total number of faults for the partition (twelve-hundred) by the total number of scan flip-flop chains for the partition (i.e. one-hundred twenty). As such, the fault density algorithm applied to integrated circuit 200 by the scan compression ratio program 400 may yield a total fault density of (ten) for partition 118 (i.e., 1200/120=10). Similarly, the scan compression ratio program 400 running on testing apparatus 302 may calculate the fault density of the partition 114 of integrated circuit 200 by dividing the total number of faults for the partition (twenty-four hundred) by the total number of scan flip-flop chains for the partition (one-hundred twenty). As such the fault density algorithm applied to integrated circuit 200 by the scan compression ratio program 400 may yield a total fault density of (twenty) for partition 114. (i.e., 2400/120=20)

Referring to FIG. 4A, at 412, the scan compression ratio program 400 running on testing apparatus 302 may order the fault density values of the partitions 114, 118 sequentially from highest to lowest. With respect to the previous example, the scan compression ratio program 400 running on testing apparatus 302 may order the fault density values of the partitions 114, 118 in the following order: partition 114 would be first since it has a fault density value of twenty, which is higher than the fault density value of partition 118, which has a fault density value of ten. However, if there were a third partition, X, for example, with a fault density value calculated as (five), then the fault density values would be sequentially ordered from highest to lowest as 20, 10, and 5.

Referring to FIG. 4B, at 414, the scan compression ratio program 400 running on testing apparatus 302 may calculate the range of possible compression ratios from lowest to highest. As previously described, a compression ratio is the ratio between the number of scan-in pins 110 and the number of scan chains 104. For example, with respect to FIG. 2, there may be (four) scan-in pins 110 and (twelve) scan chains 104 on partition 114 which may yield a compression ratio, of 1:3 (i.e. 3 scan chains 104 per each scan-in pin 110. However, partition 118 may have 2 scan-in pins 110 and 12 scan chains 104 which may yield a compression ratio of 1:6 (i.e. 6 scan chains per 1 scan-in pin 110).

Therefore with respect to the previous example, the scan compression ratio program 400 running on testing apparatus 302 may order the compression ratio values of the partitions sequentially from lowest to highest. As such, the scan compression ratio program 400 running on testing apparatus 302 may order the compression ratios of the partitions 114, 118 in the following order: partition 118 would be first since it has a compression ratio of 1:6 which is lower than the compression ratio of partition 114, which has a compression ratio of 1:3. However, if there were a third partition, X, having a compression ratio of 1:8, then the compression ratio values would be in the sequential order from lowest to highest of 1:8, 1:6 and 1:3.

At 416, the fault density of each partition is examined to determine if the fault density is high, medium or low with respect to each partition. As in the previous example above, the scan compression ratio program 400 running on testing apparatus 302 may examine the previous sequential ordering of the partitions 114, 118 according to fault density (which was calculated at 410 above) and determine that partition 114 has a high fault density of (twenty) and partition 118 has a lower fault density of (ten). However, if there were for example, X, having a fault density of (five), then the scan compression ratio program 400 running on testing apparatus 302 may determine that partition 114 has a high fault density of (twenty), partition 118 has a medium fault density of 10 and partition X has a low fault density of (five).

At 418, the scan compression ratio program 400 running on testing apparatus 302 may determine whether the fault density of the partition is high. If the scan compression ratio program 400 running on testing apparatus 302 determines that the fault density of partition 114 is high then the scan compression ratio program 400 running on testing apparatus 302 may apply the minimum compression ratio to the partition 114 at 426. With respect to the example above, if the scan compression ratio program 400 running on testing apparatus 302 determines that the fault density of partition 114 is high (i.e. 20) then the scan compression ratio program 400 running on testing apparatus 302 may apply the minimum compression ratio to (i.e., less compression) to partition 114 at 426. As previously calculated in the above example, the minimum compression ratio was 1:3. Therefore, the lowest compression ratio of 1:3 would be applied to partition 114 with the highest fault density of 20 at 426.

If at 418, the scan compression ratio program 400 running on testing apparatus 302 determines that the fault density of the partition is not high, then at 420 the scan compression ratio program 400 running on testing apparatus 302 may determine whether the fault density of the partition is medium. With respect to the example above, if the scan compression ratio program 400 running on apparatus 302 determines that the fault density of partition 118 is medium (i.e. 10) then the scan compression ratio program 400 running on testing apparatus 302 may apply the medium compression ratio to partition 118 at 428. As previously calculated in the above example, the medium compression ratio was 1:6. Therefore, the medium compression ratio of 1:6 would be applied to the partition 118 with the medium fault density of 10 at 428.

If at 420, the scan compression ratio program 400 running on testing apparatus 302 determines that the fault density of the partition is not medium, then at 422 the scan compression ratio program 400 running on testing apparatus 302 determines that the fault density of the partition is low and the maximum compression ratio is applied to the partition. With respect to the example above, if the scan compression ratio program 400 running on testing apparatus 302 determines that the fault density of partition X is the low (i.e. 5) then the scan compression ratio program 400 running on apparatus 302 may apply the highest compression ratio to partition X at 422. As previously calculated in the above example, the highest compression ratio was 1:8. Therefore, the highest compression ratio of 1:8 would be applied to partition X with the low fault density of 5 at 422.

Then at 424, the scan compression ratio program 400 running on testing apparatus 302 determines whether the fault density of the partition is lowest in the sequential order previously determined at 412 above. If it is not partition with the lowest fault density, then at 416 the scan compression ratio program 400 running on testing apparatus 302 may determine the fault density of the remaining partitions and continue steps 416 through 424 until all the remaining partitions are examined.

Figure 5:
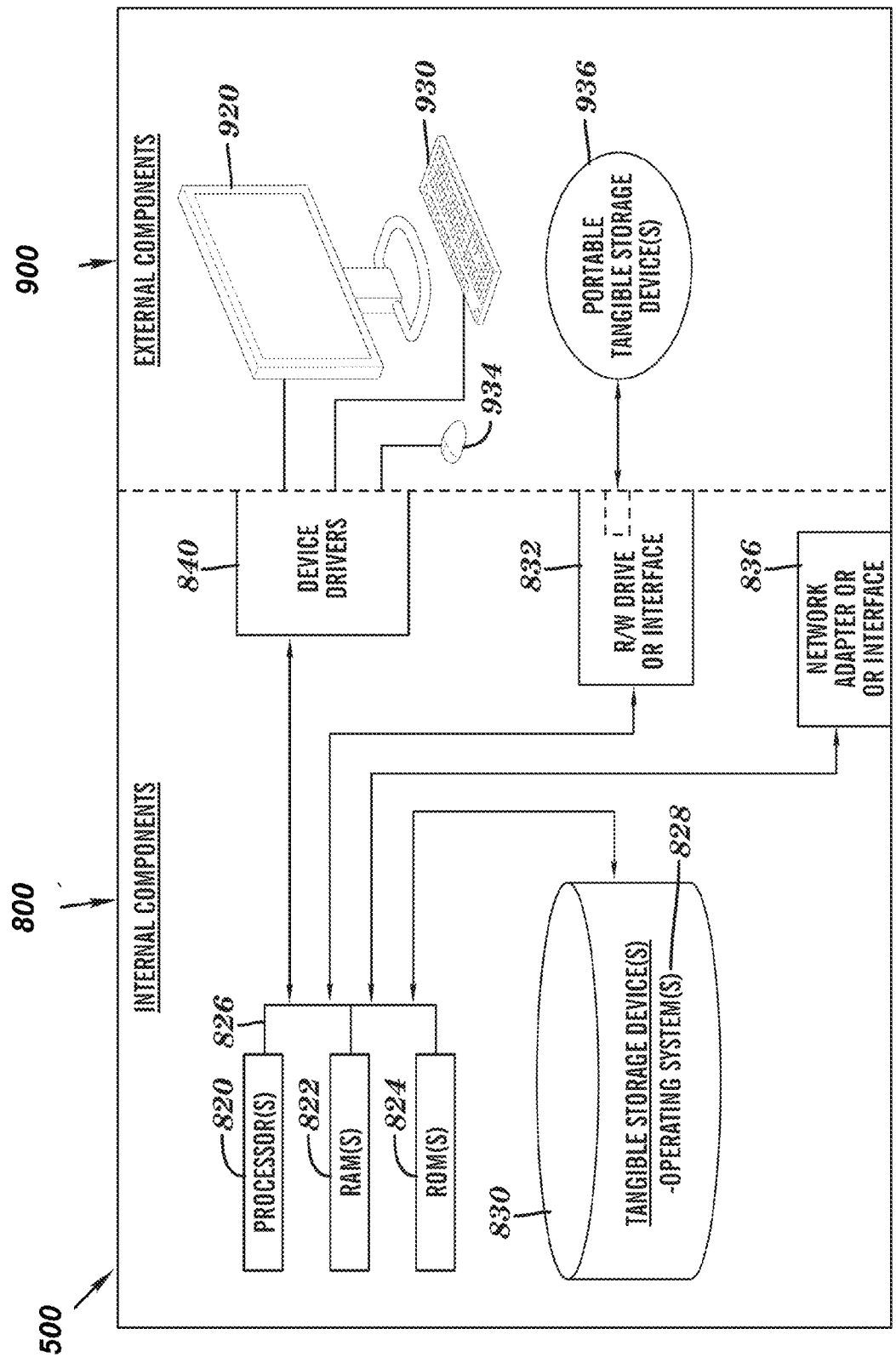
FIG. 5 is a block diagram of internal and external components of computers depicted in the embodiments of FIG. 3.

FIG. 5 is a block diagram of internal and external components of computers depicted in FIG. 1 in accordance with an illustrative embodiment of the present invention. It should be appreciated that FIG. 5 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Testing apparatus 302 (FIG. 3) includes respective sets of internal components 800 and external components 900 illustrated in FIG. 5. Each of the sets of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 in testing apparatus 302; are stored on one or more of the respective computer-readable tangible storage devices 830 for execution by one or more of the respective processors 820 via one or more of the respective RAMs 822 (which typically include cache memory). In the embodiment illustrated in FIG. 5, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. The scan compression ratio program 400 (FIGS. 4A and 4B) in testing apparatus 302 can be stored on one or more of the respective portable computer-readable tangible storage devices 936, read via the respective R/W drive or interface 832 and loaded into the respective hard drive 830.

Each set of internal components 800 also includes network adapters or interfaces 836 such as a TCP/IP adapter cards, wireless wi-fi interface cards, or 3G or 4G wireless interface cards or other wired or wireless communication links. The scan compression ratio program 400 running on testing apparatus 302 can be downloaded to testing apparatus 302 from an external computer via a network (for example, the Internet, a local area network or other, wide area network) and respective network adapters or interfaces 836. From the network adapters or interfaces 836, the scan compression ratio program 400 (FIGS. 4A and 4B) running on testing apparatus 302 (FIG. 3) is loaded into the respective hard drive 830. The network may comprise copper wires, optical fibers, wireless transmission, routers, firewalls, switches, gateway computers and/or edge servers.

Each of the sets of external components 900 can include a computer display monitor 920, a keyboard 930, and a computer mouse 934. External components 900 can also include touch screens, virtual keyboards, touch pads, pointing devices, and other human interface devices. Each of the sets of internal components 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

Based on the foregoing, computer system, method and program product have been disclosed in accordance with the present invention. However, numerous modifications and substitutions can be made without deviating from the scope of the present invention. Therefore, the present invention has been disclosed by way of example and not limitation.

What is claimed is:

1. A processor-implemented method for determining a scan compression ratio of an integrated circuit based on a fault density of the integrated circuit, the method comprising:

identifying, by a processor, a total number of scan-in pins of the integrated circuit;

identifying a plurality of partitions of the integrated circuit, wherein the identified plurality of partitions comprises a total number of identified logical and physical partitions of the integrated circuit;

determining, by an Automatic Test Pattern Generation Tool (ATPG), a total number of faults for each of the identified plurality of partitions of the integrated circuit;

identifying a total number of scan chains and a total number of flip-flops for each of the identified plurality of partitions;

calculating the fault density value for each of the identified plurality of partitions of the integrated circuit, wherein the fault density value is computed based on a ratio of the determined total number of faults for each of the identified plurality of partitions to the total number of identified flip-flops for each of the identified plurality of partitions;

determining a compression ratio for each of the identified plurality of partitions, wherein the determined compression ratio comprises a ratio between the total number of identified scan-in pins and the total number of identified scan chains; and applying the determined compression ratio for each of the identified plurality of partitions based on the calculated fault density value to each of the identified plurality of partitions of the integrated circuit.

2. The method of claim 1, wherein applying the determined compression ratio comprises:

ordering the fault density values of each of the plurality of partitions sequentially from highest to lowest;

ordering a plurality of possible compression ratios sequentially from a low compression ratio to a high compression ratio, based on the determined compression ratio for each of the plurality of partitions; and assigning the ordered plurality of compression ratios to the ordered fault density values.

3. The method of claim 1, wherein applying the determined compression ratio for each of the identified plurality of partitions comprises applying a low compression ratio to a partition having a high fault density value.

4. The method of claim 1, wherein applying the determined compression ratio for each of the identified plurality of partitions comprises applying a medium compression ratio to a partition having a medium fault density value.

5. The method of claim 1, wherein applying the determined compression ratio for each of the identified plurality of partitions comprises applying a high compression ratio to a partition having a low fault density value.

6. A computer system for determining scan compression ratio based on fault density, the computer system comprising:

one or more processors, one or more computer-readable memories, one or more computer-readable tangible storage devices, and program instructions stored on at least one of the one or more computer-readable tangible storage devices for execution by at least one of the one or more processors via at least one of the one or more computer-readable memories, the program instructions comprising:

program instructions to identify, by a processor, a total number of scan-in pins of the integrated circuit;

program instructions to identify a plurality of partitions of the integrated circuit, wherein the identified plurality of partitions comprises a total number of identified logical and physical partitions of the integrated circuit;

program instructions to determine, by an Automatic Test Pattern Generation Tool (ATPG), a total number of faults for each of the identified plurality of partitions of the integrated circuit;

program instructions to identify a total number of scan chains and a total number of flip-flops for each of the identified plurality of partitions;

program instructions to calculate the fault density value for each of the identified plurality of partitions of the integrated circuit, wherein the fault density value is computed based on a ratio of the determined total number of faults for each of the identified plurality of partitions to the total number of identified flip-flops for each of the identified plurality of partitions;

program instructions to determine a compression ratio for each of the identified plurality of partitions, wherein the determined compression ratio comprises a ratio between the total number of identified scan-in pins and the total number of identified scan chains; and program instructions to apply the determined compression ratio for each of the identified plurality of partitions based on the calculated fault density value to each of the identified plurality of partitions of the integrated circuit.

7. The computer system of claim 6, wherein applying the determined compression ratio comprises:

program instructions to order the fault density values of each of the plurality of partitions sequentially from highest to lowest program instructions to order a plurality of possible compression ratios sequentially from a low compression ratio to a high compression ratio, based on the determined compression ratio for each of the plurality of partitions; and program instructions to assign the ordered plurality of compression ratios to the ordered fault density values.

8. The computer system of claim 6, wherein applying the determined compression ratio for each of the identified plurality of partitions comprises applying a low compression ratio to a partition having a high fault density value.

9. The computer system of claim 6, wherein applying the determined compression ratio for each of the identified plurality of partitions comprises applying a medium compression ratio to a partition having a medium fault density value.

10. The computer system of claim 6, wherein applying the determined compression ratio for each of the identified plurality of partitions comprises applying a high compression ratio to a partition having a low fault density value.

11. A computer program product for determining scan compression ratio based on fault density, the computer program product comprising:

one or more non-transitory computer-readable storage devices and program instructions stored on at least one or more tangible storage devices, the program instructions executable by a processor, the program instructions comprising:

program instructions to identify, by a processor, a total number of scan-in pins of the integrated circuit;

program instructions to identify a plurality of partitions of the integrated circuit, wherein the identified plurality of partitions comprises a total number of identified logical and physical partitions of the integrated circuit;

program instructions to determine, by an Automatic Test Pattern Generation Tool (ATPG), a total number of faults for each of the identified plurality of partitions of the integrated circuit;

program instructions to identify a total number of scan chains and a total number of flip-flops for each of the identified plurality of partitions;

program instructions to calculate the fault density value for each of the identified plurality of partitions of the integrated circuit, wherein the fault density value is computed based on a ratio of the determined total number of faults for each of the identified plurality of partitions to the total number of identified flip-flops for each of the identified plurality of partitions;

program instructions to determine a compression ratio for each of the identified plurality of partitions, wherein the determined compression ratio comprises a ratio between the total number of identified scan-in pins and the total number of identified scan chains; and program instructions to apply the determined compression ratio for each of the identified plurality of partitions based on the calculated fault density value to each of the identified plurality of partitions of the integrated circuit.

12. The computer program product of claim 11, further comprising:

program instructions to order the fault density values of each of the plurality of partitions sequentially from highest to lowest;

program instructions to order a plurality of possible compression ratios sequentially from a low compression ratio to a high compression ratio, based on the determined compression ratio for each of the plurality of partitions; and program instructions to assign the ordered plurality of compression ratios to the ordered fault density values.

13. The computer program product of claim 11, wherein applying the determined compression ratio for each of the identified plurality of partitions comprises applying a low compression ratio to a partition having a high fault density value.

14. The computer program product of claim 11, wherein applying the determined compression ratio for each of the identified plurality of partitions comprises applying a medium compression ratio to a partition having a medium fault density value.

15. The computer program product of claim 11, wherein applying the determined compression ratio for each of the identified plurality of partitions comprises applying a high compression ratio to a partition having a low fault density value.

* * * * *